United States Patent [19]
Masaki et al.

[11] Patent Number: 6,004,705
[45] Date of Patent: Dec. 21, 1999

[54] PHOTOSENSITIVE CERAMICS GREEN SHEET

[75] Inventors: Takaki Masaki, Otsu; Takao Kitagawa, Yasu-gun; Akiko Yoshimura; Keiji Iwanaga, both of Otsu, all of Japan

[73] Assignee: Toray Industries, Inc., Japan

[21] Appl. No.: 08/681,483

[22] PCT Filed: Jun. 25, 1993

[86] PCT No.: PCT/JP93/00862

§ 371 Date: Mar. 7, 1994

§ 102(e) Date: Mar. 7, 1994

[87] PCT Pub. No.: WO94/01377

PCT Pub. Date: Jan. 20, 1994

Related U.S. Application Data

[63] Continuation of application No. 08/204,293, Mar. 7, 1994.

[30] Foreign Application Priority Data

Jul. 7, 1992 [JP] Japan ................................. 4-180077
Feb. 26, 1993 [JP] Japan ................................. 5-038325

[51] Int. Cl.$^6$ ................................................. G03C 3/00
[52] U.S. Cl. ..................... 430/15; 430/320; 430/286.1; 430/156; 430/166; 430/167; 430/190; 430/194
[58] Field of Search ................. 430/287.1, 286.1, 430/320, 15, 18, 156, 157, 158, 162, 165, 166, 167, 189, 190, 192, 193, 194, 197

[56] References Cited

U.S. PATENT DOCUMENTS

| | | | |
|---|---|---|---|
| 4,716,097 | 12/1987 | Weed | 430/327 |
| 4,766,671 | 8/1988 | Utsumi et al. | 427/97 |
| 4,876,476 | 10/1989 | Kittaka et al. | 310/320 |
| 5,057,360 | 10/1991 | Osaka et al. | 428/220 |
| 5,302,627 | 4/1994 | Field et al. | 522/13 |

FOREIGN PATENT DOCUMENTS

| | | |
|---|---|---|
| A1-0 131 153 | 1/1985 | European Pat. Off. . |
| A3-0 163 478 | 12/1985 | European Pat. Off. . |
| A2-0 357 063 | 3/1990 | European Pat. Off. . |
| 63-099958 | 5/1988 | Japan . |
| 63-050149 | 3/1991 | Japan . |
| A-03 239 703 | 10/1991 | Japan . |

*Primary Examiner*—Maria Nuzzolillo
*Assistant Examiner*—Laura Weiner
*Attorney, Agent, or Firm*—Austin R. Miller

[57] ABSTRACT

A ceramics green sheet which is suitably used for producing sintered ceramics substrates and the like is disclosed. The ceramics green sheet according to the present invention includes a ceramics powder, a photoinitiator, a UV absorber such as photoinitiation inhibitor organic dyes and inorganic powders, and a photosensitive resin composition. The ceramics green sheet according to the present invention has an advantage that via holes and through holes may be very easily formed with high precision, and fine holes may be formed reliably and inexpensively.

13 Claims, 1 Drawing Sheet

PHOTOSENSITIVE CERAMICS GREEN SHEET

This application is a continuation of application Ser. No. 08/204,293, filed Mar. 7, 1994.

TECHNICAL FIELD

The present invention relates to a ceramics green sheet suitably used for forming sintered ceramics substrate and the like. More particularly, the present invention relates to a green sheet made of ceramics, which is suitably employed for forming sintered ceramics substrates on which semiconductor devices connected to one another are mounted with a high density, especially for forming multilayer ceramics substrates.

PRIOR ART

Processes for producing multilayer ceramics substrates are largely classified into thick film printing lamination method and green sheet method. In the thick film printing lamination method, electroconductive paste and insulation paste are alternately printed and laminated to form a multilayer structure. After repeating printing and drying, sintering is carried out in one process.

In the green sheet lamination method, electric conductors are printed when the sheets are laminated. A number of green sheets in which via holes (holes which are through each layer) and through holes (holes which are through the entire multilayer sheet)(via holes and through holes are hereinafter collectively referred to as "via holes") are laminated and bonded by heat compression bonding, followed by sintering. This process has, as will be described in detail, a drawback in that the diameter of the via holes cannot be made small and a number of molds and jigs are necessary for forming the via holes.

Conventional ceramics green sheets are produced usually by appropriately blending ceramics powder, an organic binder, plasticizer, solvent and, if necessary, a dispersant, mixing these components to obtain a slurry, and forming green sheets from the obtained slurry by the known doctor blade method or the like, as described in Japanese Laid-open Patent Application (Kokai) Nos. 1-232797 and 2-141458.

After shaping the green sheets into a desired shape by using a cutter or a punching tool, via holes are formed in the green sheets by using a metal mold or a punching die, or by using a laser beam.

For example, in a process for producing a multilayer substrate by green sheet multilayer lamination method, a slurry which is the material for forming the green sheets is continuously and thinly spread on a carrier film to form a green sheet. The green sheet is then punched to a requisite work size and via holes are formed therein. In the via holes, electroconductive paste is embedded by an ordinary screen printing method. In cases where the thickness of the green sheet is as small as 50 µm or less, holes are formed in the green sheet together with the carrier film to provide the via holes.

However, in cases where the via holes are formed in the green sheets by using a conventional punching die made of tungsten carbide, since the strength of the tungsten carbide is low, it is difficult to prepare a punch having a small diameter. Further, the production yield of the green sheets in which via holes are formed by using a punch having a small diameter is extremely low, it is practically impossible to form a hole having a diameter of not more than 0.1 mm. Thus, the practical value of the conventional green sheets produced by this method is extremely low. Since the area occupied by via holes in a substrate is proportional to the square of the diameter of the via holes, a number of advantages such as compaction and high densification of the circuit substrates are expected to be obtained if fine via holes can be formed. However, as long as the via holes are formed by the conventional methods, it is impossible to attain such advantages.

Further, if a tungsten carbide tool is used, the green sheets are contaminated with cut powder which may cause an insulation failure. In addition, in cases where the holes are formed by using a tungsten carbide punch, since the ceramics to be processed is harder than tungsten carbide, the tungsten carbide punch is attrited and must be frequently replaced. The cost for forming the holes is expensive, which is 50% or more of the cost for producing the substrates.

Although holes are also practically formed in sintered ceramics substrates by laser beam radiation, a long time is required to form a number of holes, so that this process is not suited for mass production. Further, if the holes are formed by using a laser beam, so called "burrs" are formed on the backside, so that via holes with high precision cannot be obtained and it is necessary to polish the substrates after sintering.

In conventional methods, when the thickness of the green sheet is not more than 50 µm, especially not more than 20 µm, since the strength of the green sheet is small, the holes are formed in a condition that the green sheet is intimately contacted with a protective film such as polyester or PPS film. This process has problems in that the debris generated by the processing is attached to the backside of the green sheet after the holes are formed and that the green sheet is deformed when the protective film is peeled off. Further, since the protective film is disposed, the cost of the green sheet is made high.

Because of the necessity to process a large amount of data, the progress in the data processing technique is very rapid. The semiconductor devices constituting the main part of the data processing apparatuses are mounted on ceramics circuit substrates with high density. Since the number of terminals per one semiconductor chip is large, the number of the patterned lines on a circuit substrate is large, and so multilayer circuit structure is necessary. Thus, it is important to easily and quickly form the via holes and to make the via holes small.

DISCLOSURE OF THE INVENTION

The present invention was provided in view of the above-mentioned drawbacks in the prior art. The object of the present invention is to overcome the drawbacks of the conventional ceramics green sheets, and to provide a ceramics green sheet in which via holes and through holes can be formed very easily with high precision, and in which fine holes can be formed reliably.

This object is attained by providing a ceramics green sheet comprising a ceramics powder and a photosensitive resin composition.

That is, according to the present invention, photosensitivity is given to the green sheet per se made of ceramics. With this green sheet, via holes can be formed very easily with high precision by employing a photolithography technique, so that fine holes can be formed inexpensively and effectively.

With the green sheet according to the present invention, via holes can be formed very easily with high precision, and fine holes can be formed inexpensively and effectively.

Further, the ceramics multilayer substrate prepared from the ceramics green sheets according to the present invention has excellent performance. Further, since drastically small via holes and through holes can be formed, high reliability, high performance, high densification and the like can be attained. For example, in a green sheet sizing 150 mm×150 mm, the total number of via holes is 2000–3000 and among these, the number of via holes for signals is about 1500. According to the present invention, the diameter of the via holes can be made small and via holes can be formed uniformly with high precision, so that compaction of the sheet is attained. In addition, the reliability of the electro-conductive paste is drastically increased. That is, by making the diameter of the via holes be not more than 0.1 mm, preferably not more than 0.05 mm, printing of the electro-conductive paste in the via holes is made easy, so that insufficient embedding and drop out of the paste are avoided.

Further, when the electroconductive paste is sintered,-the degree of shrinkage due to sintering is made small in accordance with the smallness of the via holes, so that prominent practical effects such that the avoidance of breakage of electrodes can be attained.

BEST MODE FOR CARRYING OUT THE INVENTION

Figure 1:
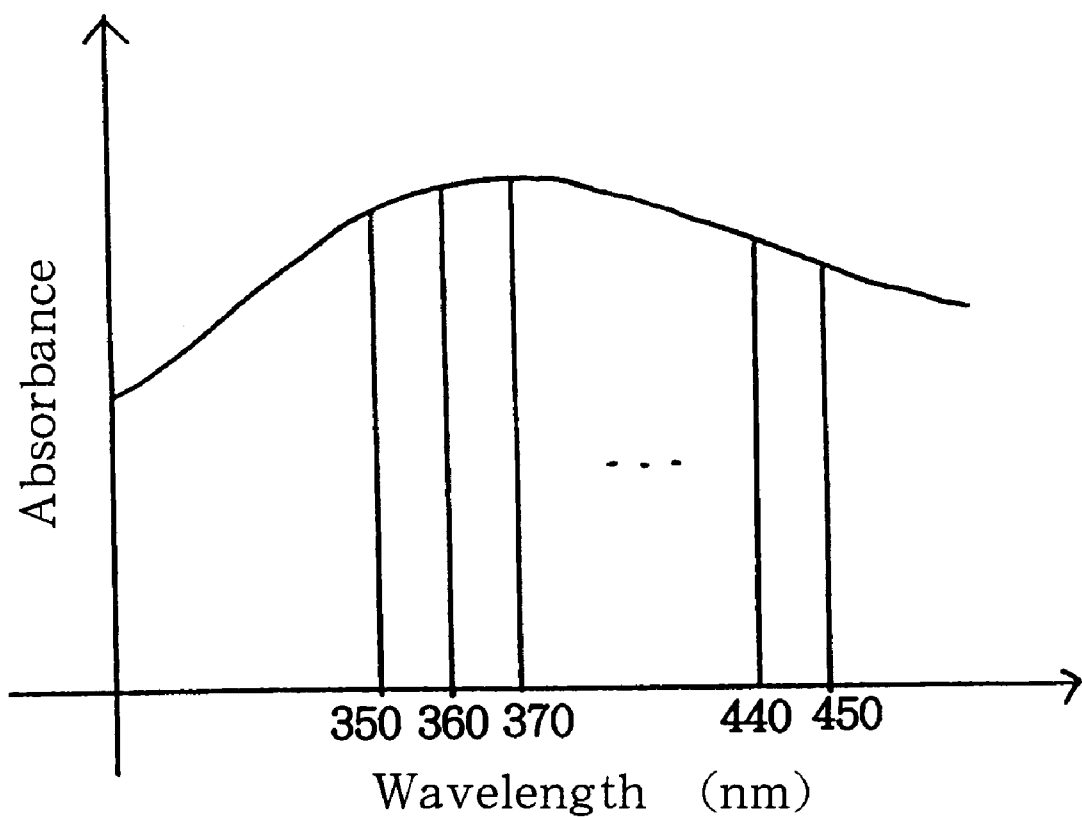
FIG. 1 is a drawing for calculating integrated value of absorbance of the ceramics powder coated with an UV absorber.

In the specification and claims, the term "green sheet" means, unless otherwise apparent from the context, a monolayer sheet obtained by applying the slurry mentioned in the production process described below and removing the solvent, which has not yet been exposed.

The ceramics powder employed in the present invention is not restricted and any of the known ceramics insulation materials which can be sintered at low temperatures can be employed.

The ceramics powder employed in the present invention include ceramics powder alone, glass-ceramics mixture and crystallized glass.

Examples of the ceramics powder which are employed in cases where ceramics powder(s) alone is(are) employed include powders of alumina ($Al_2O_3$), zirconia ($ZrO_2$), magnesia (MgO), beryllia (BeO), mullite ($3Al_2O_3.2SiO_2$), cordierite ($5SiO_2.2Al_2O_3.2MgO$), spinel ($MgO.Al_2O_3$), forsterite ($2MgO.SiO_2$), anorthosite ($CaO.Al_2O_3.2SiO_2$), celdian ($BaO.Al_2O_3.2SiO_2$), silica ($SiO_2$), clinoenstatite ($MgO.SiO_2$) and aluminum nitride (AlN), and ceramics powders sintered at low temperatures. Ceramics powders having a purity of not less than 90% by weight are preferably employed.

In cases where aluminum nitride powder alone is used, the aluminum nitride powder may contain a calcium-containing compound (e.g., $CaC_2$, $CaCO_3$, $CaCN_2$, $CaF_2$, CaO) or a yttrium-containing compound (e.g., $Y_2O_3$) in an amount of 0.5–20% by weight. Further, mixed powders containing an additive such as Y, a rare earth metal, alkaline earth metal or carbon in an amount of 0.01–15% by weight in terms of metal element, mixed powders containing a carbide such as $MgC_2$, ZrC, VC or NbC in an amount of 1–5% by weight in terms of the metal element and mixed powders containing an oxide such as BeO may be employed. A more preferred added amount of these additives is 1–10% by weight for $Y_2O_3$ and BeO, 1–5% by weight for calcium oxide and not more than 1% by weight for carbon. These additives may be employed individually or in combination. By adding the additives in amounts within these ranges, the sintering property of the aluminum nitride is promoted, so that a dense sintered material having high thermal conductivity is obtained.

Examples of the glass-ceramics mixtures include mixtures of glass composition powder such as $SiO_2$, $Al_2O_3$, CaO, $B_2O_3$, which may contain MgO and $TiO_2$ as required, and at least one inorganic filler powder selected from the group consisting of alumina, zirconia, magnesia, beryllia, mullite, cordierite, spinel, forsterite, anorthosite, celdian, silica and aluminum nitride. More preferably, the ceramics powder is a mixture of (1) 40–60% by weight of a glass composition powder and
(2) 60–40% by weight of an inorganic filler which is at least one selected from the group consisting of alumina, zirconia, magnesia, beryllia, mullite, cordierite, spinel, forsterite, anorthosite, celdian, silica and aluminum nitride, the glass composition powder containing the following compounds in the following amounts in terms of oxides:

| | |
|---|---|
| $SiO_2$ | 30–70% by weight |
| $Al_2O_3$ | 5–25% by weight |
| CaO | 5–25% by weight |
| MgO | 0–10% by weight |
| $B_2O_3$ | 3–50% by weight |
| $TiO_2$ | 0–15% by weight. |

The total of these compounds is not less than 95% by weight based on the weight of said glass composition powder. That is, the indicated amounts of $SiO_2$, $Al_2O_3$, CaO, MgO, $B_2O_3$ and $TiO_2$ are the percentages in the glass composition powder, and it is preferred that the total of these components are not less than 95% by weight in the glass composition powder. The remaining 5% by weight may contain $Na_2O$, $K_2O$, BaO, PbO, $Fe_2O_3$, Mn oxides, Cr oxides NiO, Co oxides and the like.

Examples of the glass-ceramics mixtures include $SiO_2$—$B_2O_3$ glass, PbO—$SiO_2$—$Al_2O_3$—$B_2O_3$ glass and CaO—$SiO_2$—$Al_2O_3$—$B_2O_3$ glass to which a ceramics component such as $Al_2O_3$, quartz ($SiO_2$), $ZrO_2$ or cordierite is added.

It is preferred that $SiO_2$ content in the glass composition powder is preferably 30–70% by weight. If the content is less than 30% by weight, the strength and the stability of the glass layer are decreased, and the dielectric constant and the thermal expansion coefficient are likely to be higher than the desired ranges. If the content is more than 70% by weight, the thermal expansion coefficient of the sintered substrate is high, so that it is difficult to sinter the substrate at a temperature not higher than 1000° C.

It is preferred to blend $Al_2O_3$ in an amount of 5–25% by weight. If the content is less than 5% by weight, the strength of the glass phase is decreased and it is difficult to sinter the substrate at a temperature not higher than 1000° C. If the content is more than 25% by weight, the temperature to frit the glass composition is too high.

It is preferred to blend CaO in an amount of 5–25% by weight. If the content is less than 5% by weight, the desired thermal expansion coefficient is not obtained, and it is difficult to sinter the substrate at a temperature of not higher than 1000° C. If the content is more than 25% by weight, the dielectric constant and the thermal expansion coefficient are large, so that it is not preferred.

It is preferred to blend MgO in an amount of 0–10% by weight because the control of fusion temperature is easy. If the content is more than 10% by weight, the thermal expansion coefficient of the obtained substrate is high. It is preferred to blend $B_2O_3$ in order to control the sintering temperature of the ceramics within a range of 800–1000° C. so as not to deteriorate electrical, mechanical and thermal characteristics such as dielectric constant, dielectric loss, strength, thermal expansion coefficient and sintered density, when the glass frit is fused at a temperature of 1300–1450° C. or when the content of $Al_2O_3$ is large. The content of $B_2O_3$ thereof is preferably 3–50% by weight. If the content is less than 3% by weight, the strength of the ceramics is likely to be decreased. If the content is more than 50% by weight, the stability of the glass is decreased, rate of recrystallization by the reaction between the inorganic filler (crystalline) and the glass is large, and the glass phase oozes when the multilayer substrate is produced.

It is preferred to blend $TiO_2$ in an amount of 0–15% by weight. Although the ceramics substrate sintered at a low temperature according to the present invention is a mixture of an amorphous glass and an inorganic filler before being sintered, depending on the type of the filler, it is assumed that the substrate may be a partially crystallized ceramics consisting of amorphous glass, ceramics and crystallized glass. $TiO_2$ serves as a nucleating substance effective for forming the crystallized glass, and contained preferably in the above-described range.

Inorganic filler powder is effective for promoting the mechanical strength of the substrate and for controlling the thermal expansion coefficient of the substrate. Especially, alumina, zirconia, mullite, cordierite, anorthosite and aluminum nitride have excellent effects. If the content of the inorganic filler is more than 60% by weight, the substrate is hard to sinter, so that it is difficult to sinter the substrate at a temperature not higher than 1000° C. If the content is less than 40% by weight, control of the thermal expansion coefficient is hardly attained and it is difficult to obtain a substrate with a low dielectric constant. Thus, by selecting the content of the inorganic filler powder within this range, the ceramics may be sintered at 800–1000° C. and the desired strength, dielectric constant, dielectric loss, thermal expansion coefficient, sintered density, volume intrinsic resistance and rate of shrinkage may be attained.

The inorganic filler powder employed in the present invention may contain as impurities 0–5% by weight of $Na_2O$, $K_2O$, BaO, PbO, $Fe_2O_3$, Mn oxides, Cr oxides, NiO, Co oxides and the like.

The glass composition powder may be prepared by, for example, blending $SiO_2$, $Al_2O_3$, CaO, MgO, $B_2O_3$, $TiO_2$ and the like which are the starting materials to a prescribed ratio, fusing the mixture at 1250–1450° C., rapidly cooling the melt to prepare glass frit, and by pulverizing the glass frit to fine powder having a size of 0.5–3 $\mu$m. As the material, carbonates, oxides and hydroxides with high purities can be used. Depending on the type and composition of the glass powder, it may be preferred to use uniform powder produced by the sol-gel method using ultra pure alkoxide or organic metal having a purity of not less than 99.99% because ceramics substrate having low dielectric constant, high density and high strength may be obtained.

Examples of the crystallized glass include crystallized glass of $MgO$—$Al_2O_3$—$SiO_2$ system and $Li_2O$—$Al_2O_3$—$SiO_2$ system. As the crystallized glass, the crystallized glass may also be employed, which is prepared by adding $B_2O_3$ and a nucleating agent to $MgO$—$Al_2O_3$—$SiO_2$ and by sintering the resultant at 900–1000° C., thereby precipitating cordierite crystals so as to attain a high strength; and the crystallized glass prepared by adding $B_2O_3$ and a nucleating agent to $Li_2O$—$Al_2O_3$—$SiO_2$, thereby precipitating spodumene so as to attain a high strength.

Although the particle size and the specific surface area of the ceramics powder employed in the present invention are selected taking the thickness of the green sheet to be produced and the rate of shrinkage by sintering into consideration, it is preferred that a particle size of 0.4–4 $\mu$m and a specific surface area of 0.5–5 $m^2/g$ be simultaneously satisfied. The more preferred range is 0.5–3 $\mu$m for the particle size and 0.6–3.5 $m^2/g$ for the specific surface area. If the particle size and the specific surface area are within these ranges, the UV light is sufficiently transmitted when the sheet is exposed to UV light, so that uniform via holes free from differences between the diameters of the upper portion and the lower portion of a via hole. If the particle size of the powder is less than 0.4 $\mu$m or if the specific surface area is more than 5 $m^2/g$, the powder is too fine and the light is scattered when the sheet is exposed, so that non-exposed regions are cured. Therefore, when the sheet is developed, via holes having a high roundness cannot be obtained. Further, the rate of shrinkage by sintering is large, so that a green sheet with a high precision cannot be obtained. The shape of the particles in the powder is preferably spherical which are hardly coagulated. It is preferred that the particle size distribution is sharp because the influence by scattering when the sheet is exposed to UV can be made small.

As the photosensitive resin used for forming the ceramics green sheet according to the present invention, known photosensitive resins may be employed. The photosensitive layer made of the photosensitive resin is the layer which is insolubilized or solubilized by irradiation by an active light beam. In the specification and claims, the term "photosensitive resin composition" means a composition containing a photosensitive substance which is a photosensitive polymer and/or a photosensitive monomer, and a photopolymerization initiator. In cases where a photosensitive monomer alone is contained as the photosensitive substance, a polymer binder is further contained.

Examples of the photo-insolubilized type photosensitive substances include:

(1) Mixtures of a functional monomer or an oligomer having one or more unsaturated groups per one molecule and a polymer binder;

(2) Mixtures of a photosensitive compound such as an aromatic diazo compound, aromatic azide compound or organic halogen compound and an appropriate polymer binder;

(3) Photosensitive polymers obtained by bonding photosensitive groups to a polymer as pendant groups, as well as modified products thereof; and (4) So called diazo resins such as condensed products of a diazoamine and formaldehyde.

Examples of photo-solubilzed type photosensitive substances include (1) Mixtures of an inorganic salt of a diazo compound, a complex between a diazo compound and an organic acid, or a quinone diazo compound with a polymer binder; and (2) Quinodiazo compounds bonded to an appropriate polymer binder, such as naphthoquinone-1,2-diazide-5-sulfonic acid ester of a phenolic novolak resin.

Especially preferred photosensitive substances are acrylic copolymers having carboxyl groups and ethylenically unsaturated groups in side chains. Such acrylic copolymers can be prepared by adding ethylenically unsaturated groups to side chains of an acrylic copolymer produced by copolymerizing an unsaturated carboxylic acid and an ethylenically unsaturated compound.

Specific examples of the unsaturated carboxylic acids include acrylic acid, methacrylic acid, itaconic acid, chrotonic acid, maleic acid, fumaric acid, vinylacetic acid and acid anhydrides thereof. Examples of the ethylenically unsaturated compounds include methyl acrylate, methyl methacrylate, ethylacrylate, ethyl methacrylate, n-propyl acrylate, isopropyl acrylate, n-butyl acrylate, n-butyl methacrylate, sec-butyl acrylate, sec-butyl methacrylate, isobutyl acrylate, isobutyl methacrylate, tert-butyl acrylate, tert-butyl methacrylate, n-pentyl acrylate, n-pentyl methacrylate, styrene, p-methylstyrene, o-methylstyrene and m-methylstyrene, although the ethylenically unsaturated compounds are not restricted to those described above. Copolymers having good thermal decomposition properties can be obtained by selecting at least methyl methacrylate from the above-mentioned ethylenically unsaturated compounds as the main polymerization component for constituting the main chain of the acrylic polymer.

Examples of the ethylenically unsaturated groups in the side chains include vinyl group, allyl group, acryl group and methacryl group. The side chains may be attached to the acrylic copolymer by bonding an ethylenically unsaturated compound or an acrylic chloride having glycidyl group to the carboxyl groups in the acrylic copolymer by addition reaction.

Examples of the ethylenically unsaturated compounds having glycidyl group include glycidyl acrylate, glycidyl methacrylate, allylglycidyl ether, glycidyl ethylacrylate, chrotonil glycidyl ether, chrotonic acid glycidyl ether, isochrotonic acid glycidyl ether and the like. Examples of the acrylic chloride compounds include acrylic chloride, methacrylic chloride, allyl chloride and the like. The amount of the added ethylenically unsaturated compound or the acrylic chloride is preferably 0.05–1 mole equivalent, more preferably 0.1–0.8 mole equivalent with respect to the carboxyl groups in the acrylic copolymer. If the added amount is less than 0.05 mole equivalent, the photosensitive property is not good and the formation of pattern is difficult, so that it is not preferred. If the added amount is more than 1 mole equivalent, the solubility of the non-exposed regions in the developer is decreased and the hardness of the applied film is decreased, so that it is not preferred.

The acid value (AV) of the thus obtained acrylic polymer having carboxyl groups and ethylenically unsaturated groups in the side chains is preferably 50–180, more preferably 60–160, still more preferably 80–140. If the acid value is less than 50, the amount of the ethylenically unsaturated groups is large and the percentage of the carboxyl groups having photosensitivity is small, so that the allowable conditions for developing is narrowly restricted and the edges of the via holes are not clearly cut. If the acid value is more than 180, the solubility of the non-exposed regions in the developer is low. If the concentration of the developer is increased in order to overcome this problem, peeling off is observed even in the exposed regions, so that via holes may not be formed with high precision. Further, the hardness of the green sheet is decreased. The sharper the distribution of the molecular weight of the polymer having the above-mentioned preferred acid value, the better the developing properties, so that fine via holes can be formed, which is advantageous.

Although these photosensitive polymers also serve as polymer binders, polymers which are not photosensitive may also be employed as the polymer binder components. Examples thereof include polyvinyl alcohols, polyvinyl butyrals, methacrylate polymers, acrylate polymers, acrylate-methacrylate copolymers, α-methylstyrene polymers, butyl methacrylate resins and the like. In cases where a photosensitive monomer alone is used as the photosensitive substance, it is necessary that such non-photosensitive polymer binder be contained. Examples of the solvents for the non-photosensitive polymer binder include ethanol, toluene, acetone, methylethyl ketone, butanol, trichloroethylene, methylisobutyl ketone, isophorone and the like. The polymer binder may contain a plasticizer and/or a dispersant. As the plasticizer, dibutyl phthalate, dioctyl phthalate, polyethylene glycol, glycerin and the like may be employed. As the dispersant, sorbitan acid esters, alkylene glycols and polycarboxylic acids and the like may preferably be employed.

As the photoreactive substance employed in the present invention, compounds containing carbon—carbon unsaturated bond having photoreactivity can be used. Specific examples of such compounds include allyl acrylate, benzyl acrylate, butoxyethyl acrylate, butoxy triethylene glycol acrylate, cyclohexyl acrylate, dicyclopentanyl acrylate, dicyclopentenyl acrylate, 2-ethylhexyl acrylate, glycerol acrylate, glycidyl acrylate, heptadecafluorodecyl acrylate, 2-hydroxyethyl acrylate, isobornyl acrylate, 2-hydroxypropyl acrylate, isodexyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, allylcyclohexydyl acrylate, bisphenol A diacrylate, 1,4-butanediol diacrylate, 1,3-butylene glycol diacrylate, ethylene glycol diacrylate, diethylene glycol diacrylate, triethylene glycol diacrylate, polyethylene glycol diacrylate, dipentaerythritol hexacrylate, dipentaerythritol monohydroxypentacrylate, ditrimethylolpropane tetracrylate, glycerol diacrylate, methoxycyclohexyl diacrylate, neopentyl glycol diacrylate, propylene glycol diacrylate, polypropylene glycol diacrylate, triglycerol diacrylate, and trimethylolpropane triacrylate as well as methacrylates corresponding to the above-mentioned acrylates, γ-methacryloxypropyltrimethoxy silane and 1-vinyl-2-pyrrolidone. In the present invention, one or more of these photoreactive compounds may be used.

The acrylic copolymer having carboxyl groups and ethylenically unsaturated groups in side chains is usually used in an amount of 0.5–5 times the weight of the photoreactive compound. If the amount of the acrylic copolymer is too small, the viscosity of the slurry is low and the uniformity of the dispersion in the slurry may be deteriorated. On the other hand, if the amount of the acrylic copolymer is too large, the solubility of the non-exposed regions in the developer is low.

Specific examples of the photopolymerization initiators employed in the present invention include benzophenone, o-benzoyl methyl benzoate, 4,4-bis(dimethylamine) benzophenone, 4,4-bis(diethylamino)benzophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenyl-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzyl, benzyldimethyl ketanol, benzyl-methoxyethyl acetal, benzoin, benzoin methyl ether, benzoin butyl ether, anthraquinone, 2-t-butylantharaquinone, 2-amylanthraquinone, β-chloroanthraquinone, anthrone, benzanthrone, dibenzosuberone, methyleneanthrone, 4-azidebenzalacetophenone, 2,6-bis(p-azidebenzylidene)cyclohexanone, 2,6-bis(p-azidebenzylidene)-4-methylcyclohexanone, 2-phenyl-1,2-butadione-2-(o-methoxycarbonyl)oxime, 1-phenylpropanedione-2-(o-ethoxycarbonyl)oxime, 1,3-diphenylpropanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propanone, naphthalenesulfonyl chloride, quinolinesulfonyl chloride, N-phenylthioacridone, 4,4-azobisisobutyronitrile, diphenyl disulfide, benzthiazole disulfide, triphenylphosphine, camphorquinone, tetrabromomethane, tribromophenylsulfone, benzoin peroxide and Eosine, as well as combinations of a photo-reductive pigment such as Methylene Blue and a reducing agent such as ascorbic acid or triethanolamine. One or more of these photopolymerization initiators may be employed in the present invention.

The photopolymerization initiator is added in an amount of 0.1–50%, preferably 2–25% by weight, based on the total of the acrylic copolymer having carboxyl groups and ethylenically unsaturated groups in the side chains and the photoreactive compound. If the amount of the photopolymerization initiator is too small, the photosensitivity is low, and if it is too large, the percentage of the remaining part in the exposed regions may be too small.

In the present invention, it is preferred to add a ultraviolet (UV) absorber to the photosensitive resin and the ceramics powder. By adding an absorber with a high UV-absorbing ability, high resolution is obtained.

That is, if only the ceramics powder is contained, UV is scattered by the ceramics powder, so that a part of the regions which should not be cured is undesirably photo-set. As a result, via holes may not be formed after developing or the roundness of the via holes is largely decreased. The present inventors intensively studied to identify the cause of this phenomenon to discover that this is caused by the fact that the scattered UV is absorbed or weakened and goes into the non-exposed regions. Thus, by adding an UV absorber, it is prevented that the scattered light goes into the non-exposed regions, so that the curing of the photosensitive resin in the masked regions is prevented and a pattern corresponding to the photomask is formed. Further, the light is transmitted to the lower portion of the green sheet without being absorbed and the photo-setting function is well satisfied, so that via holes with high precision are formed.

As the UV absorber, organic dyes and inorganic powders having high UV absorbances at a wavelength of 350–450 nm are preferably employed.

Various organic dyes having high absorbances may be used. More particularly, azo dyes, aminoketone dyes, xanthene dyes, quinoline dyes, anthraquinone dyes and the like may be used. Since the organic dyes added as absorbers are evaporated when the substrate is sintered and do not remain in the substrate after sintering, the insulation resistance is not decreased by the absorbers, which is preferred.

Representative examples of azo dyes include Sudan Blue ($C_{22}H_{18}N_2O_2$=342.4), Sudan R ($C_{17}H_{14}N_2O_2$=278.31), Sudan II ($C_{18}H_{14}N_2O$=276.34), Sudan III ($C_{22}H_{16}N_4O$=352.4), Sudan IV ($C_{24}H_2ON_4O$=380.45), Oil Orange SS, $CH_3C_6H_4N{:}NC_{10}H_6OH$=262.31), Oil Violet ($C_{24}H_{21}N_5$=379.46), Oil Yellow OB ($CH_3CH_4N{:}NC_{10}H_4NH_2$=261.33). Dyes which absorbs light with a wavelength of 250–520 nm may be used.

The organic dyes are added in an amount not deteriorating the bending strength, insulation resistance, dielectric constant, dielectric loss, thermal expansion coefficient and the like which are characteristic to the ceramics substrate after sintering, that is, 0.1–2% by weight based on the weight of the ceramics powder. If the content is less than 0.1% by weight, the effect of adding the UV absorber is small, and if the content is more than 2% by weight, the characteristics of the substrate after sintering are deteriorated, so that it is not preferred. More preferred amount of the added organic dye is 0.15–1% by weight.

Examples of the inorganic powder include carbon; carbides such as titanium carbide (TiC), tungsten carbide (WC), zirconium carbide (ZrC), silicon carbide (SiC) and niobium carbide (NbC); borides such as titanium boride ($TiB_2$) and zirconium boride ($ZrB_2$); and nitrides such as titanium nitride (TiN), zirconium nitride (ZrN) and tantalum nitride (TaN). Among these, preferred inorganic powders are carbon and carbides because a pattern can be formed sharply without blurring, and fine via holes in which the diameters of the upper portion and the lower portion are not different can be formed. Carbon is especially preferred since it is volatilized as carbon dioxide gas when the substrate is sintered in an oxygen-containing atmosphere, so that the deterioration in the insulation and dielectric characteristics of the ceramics substrate can be minimized.

Although the inorganic powder may be a mixture of two or more of oxides, nitrides and carbides, it is preferred to select the inorganic powders such that the insulation and dielectric characteristics of the ceramics substrate are not deteriorated. A preferred amount of the inorganic powder is 0.2–5% by weight. If the content is less than 0.2% by weight, the effect of adding the UV absorber is small, and if it is more than 5% by weight, the characteristics of the substrate are deteriorated, so that it is not preferred. A more preferred amount of the inorganic powder is 0.25–3% by weight.

In cases where the UV absorber is an organic dye, it is preferred to add the organic dye by the following method. That is, a solution containing the organic dye in an organic solvent is prepared. The ceramics powder is then added to the organic solution and the resulting mixture is stirred and then dried. By this method, the surface of each particle of the ceramics powder is uniformly coated with the organic dye, that is, ceramics powder encapsulated with the organic dye is obtained. In cases where an inorganic powder such as carbon is added as the UV absorber, it is preferred to uniformly form a coating layer of carbon on the surface of each particle of the ceramics powder by CVD (chemical vapor deposition) method or by using an organic polymer.

In the present invention, there is a range of the preferred integrated value of absorbance at 350–450 nm. More particularly, the integrated value of the absorbance is measured in the state of powder, and is measured for organic dyes, ceramics powders whose surfaces are coated with the organic dye or carbon, and for mixed powders of the inorganic powder having a high UV absorbance and the ceramics powder.

In the present invention, absorbance is defined as follows. That is, a sample is irradiated with a light in an integrating sphere and the reflected light is collected and detected by a commercially available spectrophotometer. The light other than that detected in the integrating sphere is taken as absorbed light, and the absorbance is calculated according to the equation described below.

The light intensity of the light reflected by the sample is expressed as ($I$–$I_0$) (wherein I represents light intensity of the light impinged to the sample, and $I_0$ represents the light intensity absorbed by the sample), and the absorbance is defined by the following equation (1)

$$\text{Absorbance} = -\log\frac{(I - I_0)}{Ir} \quad (1)$$

(wherein Ir represents the light intensity of the control light (i.e., the light intensity reflected by $BaSO_3$ sample mounted on the sample table, which is the material coated on the inside of the integrating sphere)). The absorbance is measured as follows:

1. A powder to which an absorber is added is shaped into a size with a diameter of 20 mm and a thickness of 4 mm by using a press machine.
2. The obtained molded powder is mounted on a sample mount in the integrating sphere, and the absorbance is determined in the wavelength range of 200–650 nm by measuring the reflected light. By so doing, a graph like FIG. 1 is obtained. In FIG. 1, the ordinate indicates the absorbance calculated according to equation (1) and the abscissa indicates the wavelength of the light measured.
3. In FIG. 1, the range of 350–450 nm is divided into 10 sections each of which has 10 nm width, and the area of each section is calculated.

For example, assuming that

---
the absorbance at 350 nm is 0.75,
the absorbance at 360 nm is 0.80,
the absorbance at 370 nm is 0.85
. . .
. . .
. . .
the absorbance at 440 nm is 0.60, and
the absorbance at 450 nm is 0.55.
---

The area ① between 350 nm and 360 nm is calculated according to the following equation, taking the shape of the section as a trapezoid:

$$\text{Area ① of 350–360 nm} = \frac{(0.75 + 0.80) \times 10}{2} = 7.75$$

Similarly, the area ② is calculated as follows:

$$\text{Area ② of 350–360 nm} = \frac{(0.80 + 0.85) \times 10}{2} = 8.25$$

⋮

Similarly, the area ⑩ is calculated as follows:

$$\text{Area ⑩ of 440–450 nm} = \frac{(0.60 + 0.55) \times 10}{2} = 5.75$$

The integrated value S of the areas of the 10 sections is calculated as follows:

S=①+②+③+ . . . +⑩

This area S is defined as the integrated value of absorbance at 350–450 nm.

In the present invention, the preferred range of the above-described integrated value of absorbance is 30–150, more preferably 40–100. If the absorbance is less than 30, the UV is scattered by the powder before the UV is sufficiently transmitted to the lower portion of the green sheet, so that non-exposed regions are cured, and so via holes with high roundness may not be formed. If the absorbance is more than 150, the light is absorbed before reaching the lower portion of the green sheet, so that the lower portion of the sheet cannot be photo-set. As a result, the lower portion is peeled off during developing, so that formation of via holes is difficult.

In some cases, metals such as Pb, Bi, Fe, Ni, Mn, Co and Mg and oxides thereof contained in the UV absorber react with the carboxyl groups of the photosensitive polymer contained in the slurry, so that the slurry for forming the green sheet is gelled in a short time. As a result, the slurry is agglomerated and cannot be formed into a green sheet. This is presumably caused by ion cross-linking reaction between the photosensitive polymer and the above-mentioned metals and oxides thereof. In order to prevent such a cross-linking reaction, it is preferred to add a compound (stabilizer) which does not give an adverse affect to the photosensitive polymer as well as to the photoreactive compound, photopolymerization initiator, plasticizer and the like, thereby preventing the gelling of the slurry. That is, it is preferred to stabilize the photosensitive green sheet by treating the surface of the powder with a compound which forms complexes with the metal or oxide powder causing the gelling reaction, or which forms salts with the functional group of the acid.

Triazole compounds may preferably be used as the stabilizer satisfying the above-mentioned requirements. Among the triazole compounds, benzotriazole functions especially effectively. Hexamethylenetetramine, lithium naphthenate and the like are also effective for preventing gelling.

The surface of the powder of the metals and metal oxides in the ceramics powder and the UV absorber may be treated with benzotriazole by the following method. That is, a prescribed amount of benzotriazole is dissolved in an organic solvent such as methyl acetate, ethyl acetate, ethanol, methanol or the like, and the powder is sufficiently immersed in the solution for 1–24 hours. After the immersion, the mixture is naturally dried preferably at 20–30° C. to evaporate the solvent. By this operation, powder treated with benzotriazole is obtained.

The rate of the stabilizer used in the present invention (i.e., stabilizer/metals and metal oxides in the ceramics powder and UV absorber) is preferably 0.2–4% by weight, more preferably 0.4–3% by weight. If the rate is less than 0.2% by weight, the cross-linking reaction of the polymer cannot be inhibited, so that the slurry is likely to be gelled in a short time. If it is more than 4% by weight, the amount of the stabilizer is so large that it is difficult to remove the polymer binder, the photoreactive compound and the stabilizer when the green sheet is sintered in non-oxidative atmosphere, so that the characteristics of the substrate are deteriorated.

In the present invention, a sensitizer, thermal polymerization inhibitor, plasticizer, antioxidant, dispersant, organic or inorganic precipitation inhibitor and the like may preferably be added.

A sensitizer may preferably be added in order to promote the photosensitivity. Specific examples of the sensitizer include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)-benzophenone, 4,4-bis (dimethylamino)chalcone, 4,4-bis(diethylamino)chalcone, p-dimethylaminocinnamylideneindanone, p-dimethylaminobenzylideneindanone, 2-(p-dimethylaminophenylvinylene)-isonaphthothiazole, 1,3-bis (4-dimethylaminobenzal)acetone, 1,3-carbonyl-bis(4-diethylaminobenzal)acetone, 3,3-carbonyl-bis(7-diethylaminocumarin), N-phenyl-N-ethylethanolamine, N-phenylethanolamine, N-tolyldiethanolamine, N-phenylethanolamine, isoamyl dimethylaminobenzoate, isoamyl diethylaminobenzoate, 3-phenyl-5-benzoylthiotetrazole, 1-phenyl-5-ethoxycarbonylthiotetrazole and the like. In the present invention, one or more of these compounds may be used. It should be noted that some sensitizers may also be used as photopolymerization initiators. In cases where a sensitizer is added to the ceramics green sheet according to the present invention, the amount to be added is 0.1–30% by weight, more preferably 0.5–15% by weight based on the total weight of the acrylic copolymer having carboxyl groups and ethylenically unsaturated groups in the side chains and the photoreactive compound. If the amount of the sensitizer is too small, the effect of promoting the photosensitivity is not obtained. If the amount of the sensitizer is too large, the rate of remaining portions in the exposed regions may be too small.

A thermal polymerization inhibitor may preferably be added in order to promote the thermal stability during storage. Specific examples of the thermal polymerization inhibitor include hydroquinone, N-nitrosodiphenylamine, phenothiazine, p-t-butylcatechol, N-phenylnaphthylamine, 2,6-di-t-butyl-p-methylphenol, chloranil, pyrogallol and the like. In cases where a thermal polymerization inhibitor is added, the amount thereof is usually 0.1–20% by weight, preferably 0.5–10% by weight based on the total weight of the acrylic copolymer having the ethylenically unsaturated groups in the side chains and the photoreactive polymer. If the amount of the thermal polymerization inhibitor is too small, the effect of promoting the thermal stability during storage is not obtained, and if the amount of the thermal polymerization inhibitor is too large, the rate of remaining portions in the exposed regions may be too small.

Specific examples of the plasticizer include dibutyl phthalate, dioctyl phthalate, polyethylene glycol and glycerin. Although the amount of the added plasticizer is not restricted, usually 0.3–5% by weight is preferred.

An antioxidant may preferably be added in order to prevent oxidation of the acrylic copolymer during storage. Specific examples of the antioxidant include 2,6-di-t-butyl-p-cresol, butylhydroxyanisole, 2,6-di-t-4-ethylphenol, 2,2-methylene-bis-(4-methyl-6-t-butylphenol), 2,2-methylene-bis-(4-ethyl-6-t-butylphenol), 4,4-bis-(3-methyl-6-t-butylphenol), 1,1,3-tris-(2-methyl-6-t-butylphenol), 1,1,3-tris-(2-methyl-4-hydroxy-t-butylphenyl)butane, bis[3,3-bis-(4-hydroxy-3-butylphenyl)butyric acid]glycol ester, dilaurylthio dipropionate, triphenylphosphite and the like. In cases where an antioxidant is added, the amount of the added antioxidant is usually 0.01–5% by weight, more preferably 0.1–1% by weight, based on the total weight of the ceramics powder, the acrylic copolymer having ethylenically unsaturated groups in the side chains, the photoreactive compound, the glass frit and the photopolymerization initiator. If the amount of the antioxidant is too small, the effect of preventing the oxidation of the acrylic copolymer during storage is not obtained. If the amount of the antioxidant is too large, the rate of remaining portions in the exposed regions may be too small.

As the dispersant, sorbitan acid esters, alkylene glycols, polycarboxylic acids and the like may preferably be employed. Although the amount of the added dispersant is not restricted, it is usually 0.3–3% by weight.

Examples of the precipitation inhibitor include ethylene oxide, propylene oxide, maleic acid partial esters, amorphous silica and the like. Although the amount of the added precipitation inhibitor is not restricted, it is usually 0.2–3% by weight.

The preferred composition of the slurry for forming the ceramics green sheet according to the present invention is as follows:

(a) ceramics powder; 78–92% by weight
(b) acrylic copolymer having carboxyl groups and ethylenically unsaturated groups in the side chains and the photoreactive compound; 22–8% by weight
(c) photopolymerization initiator; 2–25% by weight based on (b)
(d) UV absorber; 0.1–5% by weight based on (a)

More preferably, the contents of the above-described components (a), (b) and (d) is 83–90% by weight, 17–10% by weight, and 0.25–1% by weight, respectively. If the contents of these components are within these ranges, UV light is well transmitted during exposure, so that the UV light well exhibits its photo-setting function. Thus, after developing, remaining of non-exposed regions is substantially prevented and via holes having high roundness can be formed. Especially, by selecting the component (b) which is the total of the acrylicicopolymer and the photoreactive compound within the above-mentioned range, the substrate after the sintering is dense and ceramics substrate with high strength may be obtained.

The ceramics green sheet according to the present invention may be produced by applying a slurry containing the components on a substrate, and by evaporating the solvent in cases where a solvent is contained in the slurry. In a preferred mode, the slurry is prepared by dissolving the acrylic copolymer having carboxyl groups and ethylenically unsaturated groups in the side chains and the photopolymerization initiator in the photoreactive monomer, and dispersing the ceramics powder and the UV absorber in this solution. In cases where the acrylic copolymer having ethylenically unsaturated groups and the photopolymerization initiators are not dissolved in the photoreactive compound, or in cases where it is desired to control the viscosity of the solution, an organic solvent in which the mixture of the acrylic copolymer, the photopolymerization initiator and the photoreactive compound can be dissolved may be added. As this organic solvent, any organic solvent which can dissolve the mixture of the acrylic copolymer having ethylenically unsaturated groups in the side chains, the photopolymerization initiator and the photoreactive compound may be employed. Examples of this organic solvent include methyl cellosolve, ethyl cellosolve, butyl cellosolve, methylethyl ketone, dioxane, acetone, cyclohexanone, cyclopentanone, isobutanol, butanol, isopropanol, tetrahydorfuran, dimethylsulfoxide, γ-butyrolactone, toluene, acetone, trichloroethylene, methylisobutyl ketone and isophorone as well as mixtures thereof.

Further, if necessary, the above-mentioned organic solvent, stabilizer, sensitizer, thermal polymerization inhibitor, plasticizer, antioxidant, dispersant, organic or inorganic precipitation inhibitor and the like are added and the resulting mixture is pulverized and mixed using a ball mill or an attriter for, say, 12–48 hours to prepare the slurry.

In order to control the viscosity of the slurry, the above-mentioned organic solvent is added as required. Preferred viscosity is 1000–5000 cps (centi poise) because if the viscosity is within this range, the thickness of the sheet can be controlled so that a sheet with uniform thickness can be obtained. The thus obtained slurry is continuously applied on a film such as a polyester film to a thickness of 10–600 μm using a doctor blade. The applied slurry is heated at 80–120° C. for 10 minutes to 1 hour to evaporate the solvent, thereby obtaining a ceramics green sheet. This sheet is then cut into an appropriate shape.

The thickness of the ceramics green sheet according to the present invention is usually 10–600 µm, preferably 30–300 µm. If the thickness is more than 600 µm, the UV light is not well transmitted during the exposure step, so that the effect of photo-setting is reduced. If the thickness is less than 10 µm, ease of handling of the green sheet is poor, and a dense substrate after the sintering is hardly obtained, so that the characteristics of the ceramics substrate are deteriorated, which are not preferred. If the thickness is within the above-mentioned range, via holes and through holes having a diameter of 0.01–0.2 mm can be formed without giving differences in the diameters in the upper portion and the lower portion of the via holes. Although the resolution of the via holes varies depending on the thickness of the green sheet, the aspect ratio (thickness of the sheet/diameter of the via hole) is preferably not more than 1 because the UV light is well transmitted. If the thickness of the sheet is 40 µm, via holes having a diameter of 40 µm is preferred.

The ceramics green sheet is exposed using a conventional photomask. As the active light source employed for the exposure, UV light, electron beam, X-ray or the like may be employed. Among these, UV light is preferred. As the source of UV light, low pressure mercury lamp, high pressure mercury lamp, halogen lamp, sterilization lamp or the like may be employed. Among these, ultra high pressure mercury lamp is preferred. Although the conditions of exposure vary depending on the thickness of the green sheet and the like, it is preferred to expose the sheet using an ultra high pressure mercury lamp with an output power of 5–100 $mW/cm^2$ for 1–30 minutes. The method of exposure may be appropriately selected depending on the thickness of the green sheet. In cases where the thickness of the green sheet is more than 200 µm and the aspect ratio is 0.2–1, it is preferred to expose both sides of the sheet because via holes having no differences in the diameters of the upper portion and lower portion can be formed.

After the exposure, developing is carried out using a developer to remove the regions which were not photo-set, thereby forming a pattern of a so called negative type. By this, via holes with a diameter of 0.005–0.2 mm may be formed with a pitch of 0.01–5.0 mm. The developing may be carried out by the immersion method or by the spray method. As the developer, an organic solvent in which the above-described mixture of the acrylic copolymer having ethylenically unsaturated group, photoreactive compound and the photopolymerization initiator can be dissolved may be employed. To this organic solvent, water may be added in an amount not losing this dissolving ability. In cases where the acrylic copolymer has carboxyl groups in the side chains, developing can be carried out using an aqueous alkali solution. As the aqueous alkali solution, although aqueous alkaline metal-containing solution such as aqueous sodium hydroxide solution or aqueous calcium hydroxide solution may be employed, it is preferred to use an aqueous organic alkali solution because the alkali component can easily be removed during the sintering. Specific examples of the organic alkali include tetramethylammonium hydroxide, trimethylbenzylammonium hydroxide, monoethanolamine, diethanolamine and the like. The concentration of the aqueous alkali solution is usually 0.01–3% by weight, more preferably 0.1–2% by weight. If the alkali concentration is too low, non-exposed regions may not be removed, and if the alkali concentration is too high, peeling off of the exposed regions may occur and the sheet may be corroded, which are not preferred.

In the signal layer or electric source layer in the via holes, conductors for connecting the lines in different layers are formed by using a electroconductive paste. The electroconductive paste used herein is the same as, or different from that used for forming the circuit pattern, that is, electroconductive paste containing copper, silver, silver-palladium, tungsten, molybdenum or gold. The embedding of the electroconductive paste is carried out by employing screen printing, squeezing, a dispenser or a roller. The embedding of the electroconductive paste in the via holes in the green sheet is carried out repeatedly sheet by sheet.

Further, as required, a prescribed pattern of conductor, dielectric material or a resist is formed on the surface of the sheet. Guide holes are formed by the same method as that for forming the via holes.

A requisite number of sheets are laminated using the guide holes and the laminate is subjected to thermocompression bonding at a temperature of 90–130° C. under a pressure of 50–200 $kg/cm^2$ to obtain a multilayer sheet.

The sheet is then sintered in a sintering furnace to obtain a multilayer ceramics green sheet having conductors in the via holes. The atmosphere and the temperature employed in the sintering varies depending on the types of the ceramics substrate and the conductors. In cases where the multilayer substrate made of ceramics or glass-ceramics is for low temperature sintering, the sheet is kept usually at 850–1000° C. for several hours to sinter the insulation layer. In cases where the substrate is made of alumina or aluminum nitride, the substrate is sintered usually at 1600° C. for several hours. In cases where the conductors contain Cu, W, Mo, W-Mo or the like, the substrate is sintered in a reducing atmosphere containing a neutral gas such as nitrogen, or hydrogen. Any atmosphere which enables oxidation and evaporation of the organic compounds such as acrylic copolymer having ethylenically unsaturated groups in the side chains, the photoreactive polymerizable compound, the stabilizer and the like contained in the photosensitive green sheet during the sintering may be employed. For example, in cases where the conductors are Cu, W, Mo or W-Mo, the sintering may be carried out in a controlled atmosphere containing 3–50 ppm of oxygen and the balance of a neutral gas such as nitrogen or argon, or water vapor. The sintering may be performed by first keeping the substrate at a temperature of 300–550° C. for 30 minutes to several hours to completely oxidizing and evaporating the organic binder, and then at 800–1600° C. for several hours to prepare a ceramics multilayer substrate.

It is preferred that the amount of the carbon remaining in the multilayer substrate after sintering be not more than 250 ppm. If the amount of the residual carbon is large, problems that the porosity of the multilayer substrate is decreased, the strength is decreased, the dielectric constant is increased, the dielectric loss is increased, the leak current is increased, and that insulation resistance is decreased may be brought about. The amount of the residual carbon is more preferably not more than 100 ppm, still more preferably not more than 50 ppm.

EXAMPLES

The invention will now be described more concretely by way of examples thereof. It should be noted that the examples are presented for the illustration purpose only and should not be interpreted in any restrictive way.

Examples 1–16

In the following examples, all concentrations are based on weight unless otherwise specified.

A. Ceramics Component

The following ceramics components were used.

(1) Alumina powder; polyhedral powder having an average particle size of 1.5 μm (2) Cordierite powder; spherical powder having an average particle size of 1.2 μm (3) Glass-ceramics powder containing 50% of alumina (inorganic filler) and 50% of glass powder. The glass composition is $SiO_2$; 60, CaO; 20, $Al_2O_3$; 20, MgO; 5, $B_2O_3$; 5, $TiO_2$; 3. The glass powder was preliminarily pulverized by an attriter to fine particles having an average particle size of 2.2 μm and a specific surface area of 1.3 m²/g.

(4) Glass-ceramics powder containing 50% of ceramics powder (inorganic fillers) and 50% of glass powder. The ceramics powder contains of 25% of mullite powder, 5% of spinel and 20% of silica based on the weight of the glass-ceramics powder. The glass powder has a composition of $SiO_2$; 52%, CaO; 20%, $Al_2O_3$; 13%, MgO; 2%, $B_2O_3$; 8%, $TiO_2$; 3%. The glass powder was preliminarily pulverized by an attriter to fine particles having an average particle size of 1.5 μm and a specific surface area of 1.2 m²/g.

(5) Crystallized glass ($MgO$—$Al_2O_3$—$SiO_2$—$B_2O_3$) powder: Powder having an average particle size of 1.8 μm was used.

(6) Zirconia powder: spherical powder having an average particle size of 1.0 μm

B. Polymer Binder

Binder I; An acrylic copolymer containing 40% of methacrylic acid (MAA), 30% of methyl methacrylate (MMA) and 30% of styrene (St), which has 0.4 equivalents (corresponding to 40%) of glycidyl acrylate (GMA) attached to the carboxylic groups (MAA) of the acrylic copolymer by addition reaction.

Binder II; An acrylic copolymer containing 30% of methacrylic acid (MAA), 35% of ethyl methacrylate (EMA) and 35% of styrene (St), which has 0.3 equivalents (corresponding to 30%) of chloride acrylate attached to the carboxylic groups (MAA) of the acrylic copolymer by addition reaction.

C. Monomer

Monomer I; trimethylolpropane triacrylate

Monomer II; ½ mixture of 2-hydroxyethyl acrylate/propylene glycol diacrylate

D. Solvent

A mixed solvent of γ-butyrolactone, isopropyl alcohol, methyl alcohol and methylethyl ketone (10:10:40:40).

E. Photopolymerization Initiator

Initiator I; α-aminoacetophenone

Initiator II; benzophenone

<Preparation of Green Sheet>

A. Preparation of Organic Vehicle

The solvent and the polymer binder were mixed and the mixture was heated to 120° C. under stirring to uniformly dissolve the entire polymer binder. The solution was then cooled to room temperature and the initiator was added and dissolved. The resulting solution was filtered through a 400-mesh filter.

B. Preparation of Slurry

The photoreactive compound and the ceramics powder were added to the above-described organic vehicle to attain a prescribed composition. The mixture was mixed using an attriter for 24 hours in wet condition to obtain a slurry. The viscosity of the prepared slurry determined using a Brookfield viscometer (type: PVDV-II+) at a revolution of 50 rpm was 1500 cps. The compositions of the slurries are shown in Tables 1, 2 and 3.

TABLE 1

|  | Example 1 | Example 2 | Example 3 | Example 4 | Example 5 | Example 6 |
|---|---|---|---|---|---|---|
| ① Alumina | 78 | 83 | 83 | 83 | 85 | 85 |
| ② Cordierite | 0 | 0 | 0 | 0 | 0 | 0 |
| ③ Glass-ceramics | 0 | 0 | 0 | 0 | 0 | 0 |
| ④ Glass-ceramics | 0 | 0 | 0 | 0 | 0 | 0 |
| ⑤ Crystallized Glass | 0 | 0 | 0 | 0 | 0 | 0 |
| ⑥ Zirconia | 0 | 0 | 0 | 0 | 0 | 0 |
| Polymer Binder I | 15 | 10 | 10 | 0 | 7.5 | 0 |
| Polymer Binder II | 0 | 0 | 0 | 9 | 0 | 7.5 |
| Monomer I | 7 | 7 | 7 | 0 | 7.5 | 7.5 |
| Monomer II | 0 | 0 | 0 | 8 | 0 | 0 |
| Photopolymerization Initiator I | 3 | 2 | 2 | 2 | 0 | 0 |
| Photopolymerization Initiator II | 0 | 0 | 0 | 0 | 2 | 2 |
| Sintering Temperature (°C.) | 1600 | 1600 | 1600 | 1600 | 1600 | 1600 |
| Thickness (μm) | 62 | 62 | 62 | 62 | 62 | 62 |

TABLE 2

|  | Example 7 | Example 8 | Example 9 | Example 10 | Example 11 |
|---|---|---|---|---|---|
| ① Alumina | 0 | 0 | 0 | 0 | 5 |
| ② Cordierite | 83 | 88 | 0 | 0 | 0 |
| ③ Glass-ceramics | 0 | 0 | 83 | 0 | 0 |
| ④ Glass-ceramics | 0 | 0 | 0 | 83 | 0 |
| ⑤ Crystallized Glass | 0 | 0 | 0 | 0 | 78 |
| ⑥ Zirconia | 0 | 0 | 0 | 0 | 0 |
| Polymer Binder I | 10 | 6 | 0 | 10 | 8 |
| Polymer Binder II | 0 | 0 | 10 | 0 | 0 |
| Monomer I | 7 | 6 | 0 | 0 | 4 |
| Monomer II | 0 | 0 | 7 | 7 | 0 |
| Photopolymerization Initiator I | 2 | 1.5 | 0 | 0 | 3 |
| Photopolymerization Initiator II | 0 | 0 | 2.5 | 2.5 | 0 |
| Sintering Temperature (°C.) | 950 | 950 | 900 | 900 | 900 |
| Thickness (μm) | 58 | 58 | 60 | 60 | 65 |

TABLE 3

|  | Example 12 | Example 13 | Example 14 | Example 15 | Example 16 |
|---|---|---|---|---|---|
| ① Alumina | 0 | 0 | 0 | 0 | 0 |
| ② Cordierite | 0 | 0 | 0 | 0 | 0 |
| ③ Glass-ceramics | 0 | 0 | 0 | 0 | 0 |
| ④ Glass-ceramics | 0 | 0 | 0 | 0 | 0 |
| ⑤ Crystallized Glass | 83 | 88 | 0 | 0 | 0 |
| ⑥ Zirconia | 0 | 0 | 83 | 88 | 90 |
| Polymer Binder I | 0 | 8 | 9 | 8 | 3 |
| Polymer Binder II | 8.5 | 0 | 8 | 0 | 0 |
| Monomer I | 8.5 | 4 | 0 | 4 | 0 |
| Monomer II | 0 | 0 | 0 | 0 | 7 |
| Photopolymerization Initiator I | 2.5 | 0 | 0 | 0 | 2 |
| Photopolymerization Initiator II | 0 | 0 | 2.5 | 2.5 | 0 |
| Sintering Temperature (°C.) | 900 | 900 | 1400 | 1400 | 1400 |
| Thickness (μm) | 65 | 65 | 70 | 70 | 65 |

C. Preparation of Green Sheet

Molding of the green sheets was carried out by the doctor blade method in an UV-cut room. The gap between the polyester carrier film and the blade was 0.6–0.8 mm and the molding rate was 1 m/min. The thicknesses of the obtained green sheets are shown in Tables 1, 2 and 3.

D. Exposure and Development

Each of the green sheets prepared above was cut into square pieces sizing 150 mm×150 mm, and each of the square pieces was heated at 90° C. for 40 minutes to evaporate the solvent. Through a chromium mask having 3000 via holes with a diameter of 40 μm, the sheet was exposed to UV light emitted from an ultra high pressure mercury lamp with an output power of 50 mW/cm², which lamp was arranged above the mask. The sheet was then immersed in 1 wt % aqueous monoethanolamine solution kept at 25° C. to develop the sheet and the via holes which were not photo-set were washed off with water using a spray.

E. Printing and Lamination

In the sheets containing cordierite, glass ceramic powders (3) and (4), or crystallized glass powder (5), in the via holes formed in the green sheets, thick silver-palladium alloy paste was embedded by the screen printing method to form conductors for connecting lines of different layers. On the surface of the green sheet, a prescribed circuit pattern is printed using the same thick paste as mentioned above. On the other hand, in the green sheets containing alumina powder (1) or zirconia powder (6), as the metal paste for being embedded in the via holes and for forming the circuit pattern, W was used.

Ten green sheets on which the silver-palladium alloy or W conductor was printed were laminated using a guide hole, and the laminate was subjected to thermocompression bonding at 120° C. under a pressure of 150 kg/cm² to obtain multilayer ceramics green sheets each of which has 10 layers.

F. Sintering

The thus obtained 10-ply laminates were baked in the air at 500° C. for 3 hours to evaporate the binder, and then sintered at 900–1000° C. for 0.5 hours to obtain multilayer ceramics substrates.

The green sheets having W as the conductor were baked in an atmosphere of $H_2$ (hydrogen) gas and $N_2$ (nitrogen) gas at 500° C. for 5 hours to remove the binder and then sintered at 1600° C. for 0.5 hours to obtain multilayer ceramics substrates.

Thus, by employing the green sheet containing a photo-setting resin, via holes are formed by photolithography, so that the produced ceramics multilayer substrate can have fine via holes, which is advantageous for compaction and high densification of the devices. A screen for forming via holes is not necessary, and the green sheets are aligned by self-alignment. Therefore, unlike the conventional green sheets, the green sheets according to the present invention are not shifted when they are laminated.

Since uniform via holes can be formed by photo-setting and the via holes are fine, pores are not formed in the via holes, so that cutting of the lines was not observed at all. As a result, a high reliability was obtained. Further, when compared with the conventional multilayer substrates having via holes with diameters 4–8 times larger than those of the substrates according to the present invention, rate of propagation of signals was largely decreased.

Comparative Example 1

A mixture of 53% of alumina powder (1) or cordierite powder (2), 10% of acrylate resin, 24% of toluene, 8% of isopropyl alcohol and 5% of dibutyl phthalate was mixed using an attriter and green sheets having a thickness of 100 μm were prepared from the mixtures by the doctor blade method under the same conditions as mentioned above. Then 2000 via holes having a diameter of 200 μm were formed by punch press method using a metal mold.

In the same manner as in item E described above, conductors were formed using W metal paste for the green sheet containing alumina or using the silver-palladium alloy paste for the green sheet containing cordierite powder. The green sheets were then laminated and sintered under the same conditions as in F described above.

In the thus prepared ceramics multilayer circuit substrates, in the vicinity of the conductor lines and the via holes, a number of cracks, burrs and peeling off of the electrodes were observed.

Examples 17–26

A. Aluminum Nitride Powder Component (1) Spherical powder having low agglomerating property having an average particle size of 1.3 μm containing 5 parts by weight of $CaCO_3$ powder per 100 parts by weight of aluminum nitride (AlN) powder (2) Spherical powder having an average particle size of 1.2 μm containing 5 parts by weight of $Y_2O_3$ powder per 100 parts by weight of aluminum nitride powder (3) Spherical powder having an average particle size of 1.3 μm containing 2 parts by weight of $CaCO_3$ powder and 3 parts by weight of $Y_2O_3$ powder per 100 parts by weight of aluminum nitride powder B. Acrylic copolymer having carboxyl groups and ethylenically unsaturated groups in its side chains (hereinafter referred to as "polymer binder" for short)

Polymer binder I;

Copolymer containing 40% of methacrylic acid, 30% of methyl methacrylate and 30% of styrene, which has 0.4 equivalents of glycidyl acrylate attached thereto by addition reaction.

Polymer binder II;

An acrylic copolymer containing 30% of methacrylic acid (MAA), 35% of ethyl methacrylate (MMA) and 35% of styrene (St), which has 0.3 equivalents of chloride acrylate attached to the carboxylic groups (MAA) by addition reaction.

Polymer C. Photoreactive Monomer ("hereinafter referred to as "monomer" for short)

Monomer I; trimethylolpropane triacrylate

Monomer II; ½ mixture of 2-hydroxyethyl acrylate/propylene glycol diacrylate

D. Plasticizer dibutyl phthalate

<Preparation of Green Sheet>

A. Preparation of Organic Vehicle

The solvent and the polymer binder were mixed and the mixture was heated to 120° C. under stirring to uniformly dissolve the entire polymer binder. The solution was then cooled to room temperature and the photopolymerization initiator, plasticizer and the organic binder were added and dissolved. The resulting solution was filtered through a 400-mesh filter.

B. Preparation of Slurry

The monomer and the aluminum nitride powder were added to the above-described organic vehicle to attain a prescribed composition. The mixture was mixed using an attriter for 24 hours in wet condition to obtain a slurry. The viscosity of the prepared slurry determined by using a Brookfield viscometer (type: PVDV-II+) at a revolution of 50 rpm was 1700 cps. The compositions of the slurries are shown in Tables 4 and 5.

C. Preparation of Green Sheet

Molding of the green sheets was carried out by the doctor blade method in an UV-cut room. The gap between the polyester carrier film and the blade was 0.40 mm and the feed speed was 2.5 m/min. The thicknesses of the obtained green sheets are shown in Tables 4 and 5.

TABLE 4

|  | Example 17 | Example 18 | Example 19 | Example 20 | Example 21 |
| --- | --- | --- | --- | --- | --- |
| ① AlN—$CaCO_3$ | 78 | 84 | 84 | 84 | 88 |
| ② AlN—$Y_2O_3$ | 0 | 0 | 0 | 0 | 0 |
| ③ AlN—$CaCO_3$—$Y_2O_3$ | 0 | 0 | 0 | 0 | 0 |
| Polymer Binder I | 15 | 10 | 8 | 8 | 6 |
| Polymer Binder II | 0 | 0 | 0 | 0 | 0 |
| Monomer I | 7 | 6 | 8 | 8 | 6 |
| Monomer II | 0 | 0 | 0 | 0 | 0 |
| Organic Binder | 0 | 0 | 0 | 2 | 0 |
| Plasticizer | 0 | 0 | 2 | 2 | 0 |
| Photopolymerization Initiator | 3 | 2 | 2 | 2 | 1.5 |
| Thickness (μm) | 72 | 73 | 70 | 72 | 74 |

TABLE 5

|  | Example 22 | Example 23 | Example 24 | Example 25 | Example 26 |
| --- | --- | --- | --- | --- | --- |
| ① AlN—$CaCO_3$ | 85 | 0 | 0 | 0 | 0 |
| ② AlN—$Y_2O_3$ | 0 | 83 | 0 | 0 | 0 |
| ③ AlN—$CaCO_3$—$Y_2O_3$ | 0 | 0 | 83 | 83 | 83 |
| Polymer Binder I | 0 | 8.5 | 8.5 | 10 | 0 |
| Polymer Binder II | 7.5 | 0 | 0 | 0 | 10 |
| Monomer I | 7.5 | 8.5 | 8.5 | 7 | 0 |
| Monomer II | 0 | 0 | 0 | 0 | 7 |
| Organic Binder | 0 | 0 | 0 | 0 | 2 |
| Plasticizer | 0 | 0 | 0 | 2 | 2 |
| Photopolymerization Initiator | 1.5 | 2 | 2 | 2 | 2 |
| Thickness (μm) | 67 | 63 | 66 | 65 | 68 |

E. Solvent

A mixed solvent of butanol, isopropyl alcohol, methyl alcohol and toluene (75:5:5:15)

F. Photopolymerization Initiator

α-aminoacetophenone

G. Organic Binder (excluding those used as polymer binders)

polyvinylbutyral

D. Exposure and Development

Each of the green sheets prepared above was cut into square pieces sizing 120 mm×120 mm, and each of the square pieces was heated at 90° C. for 40 minutes to evaporate the solvent. Through a chromium mask having 3000 via holes with a diameter of 40 μm, the sheet was exposed to UV light emitted from an ultra high pressure mercury lamp with an output power of 50 mW/cm², which lamp was arranged above the mask. The sheet was then immersed in 1 wt % aqueous monoethanolamine solution kept at 25° C. to develop the sheet and the via holes which were not photo-set were washed off with water using a spray.

E. Printing and Lamination

In the via holes formed in the green sheets by the photo-setting method, thick W paste was embedded by the screen printing method to form conductors for connecting lines of different layers. On the surface of the green sheet, a prescribed circuit pattern is printed using the same thick paste as mentioned above. Ten green sheets on which the W conductor was printed were laminated using a guide hole, and the laminate was subjected to thermocompression bonding at 80° C. under a pressure of 90 kg/cm$^2$ for 30 minutes to obtain multilayer ceramics green sheets each of which has 10 layers.

F. Sintering

The thus obtained 10-ply green sheets were baked in an atmosphere of H$_2$ (hydrogen) gas and N$_2$ (nitrogen) gas at 500° C. for 5 minutes to remove the binder and then sintered at 1800° C. for 3 hours to obtain multilayer aluminum nitride substrates.

Thus, by employing the green sheet containing a photo-setting resin, via holes are formed by photolithography, so that the produced ceramics multilayer substrate can have fine via holes, which is advantageous for compaction and high densification of the devices. A screen for forming via holes is not necessary, and the green sheets are aligned by self-alignment. Therefore, unlike the conventional green sheets, the green sheets according to the present invention are not shifted when they are laminated.

Since uniform via holes can be formed by photo-setting and the via holes are fine, pores are not formed in the via holes, so that cutting of the lines was not observed at all. As a result, a high reliability was obtained. Further, when compared with the conventional multilayer substrates having via holes with diameters 4–8 times larger than those of the substrates according to the present invention, rate of propagation of signals was largely decreased.

Comparative Example 2

105 parts by weight of the aluminum nitride powder (1), 10 parts by weight of polyvinylbutyral, 10 parts by weight of dibutyl phthalate and 50 parts by weight of ethanol were mixed using an attriter and green sheets having a thickness of 100 μm were prepared from the mixture by the doctor blade method under the same conditions as mentioned above. Then 2000 via holes having a diameter of 200 μm were formed by punch press method using a metal mold.

In the same manner as in item E described above, conductors were formed using W metal paste, and ten green sheets were laminated. The laminates were sintered under the same conditions as in F described above.

In the thus prepared aluminum nitride multilayer circuit substrates, in the vicinity of the conductor lines and the via holes, a number of cracks, burrs and peeling off of the electrodes were observed.

Examples 27–37

A. Ceramics Component
  (1) Alumina powder; spherical powder having an average particle size of 1.7 μm, a specific surface area of 1.1 m$^2$/g and a purity of 99.5%
  (2) Cordierite powder; spherical powder having an average particle size of 2.1 μm, a specific surface area of 3.0 m$^2$/g and a purity of 99%
  (3) Glass-ceramics powder;
    50% of alumina powder (inorganic filler) and 50% of glass composition powder
    (The glass composition was SiO$_2$; 60, CaO; 20, Al$_2$O$_3$; 20, MgO; 5, B$_2$O$_3$; 5, TiO$_2$; 3. The composition was preliminarily pulverized using an attriter to fine powder having an average particle size of 2.2 μm and a specific surface area of 1.5 m$^2$/g.)

B. UV Absorber
  (1) Organic Dye; azo dye; Sudan IV
    Chemical Formula: C$_{24}$H$_{20}$N$_4$O, Molecular Weight: 380.45
  (2) Organic Dye; azo dye; Oil Yellow OB
    Chemical Formula: CH$_3$C$_9$H$_4$:NC$_{19}$H$_4$NH$_2$, Molecular Weight: 261.33

C. Polymer Binder
  An acrylic copolymer containing 40% of methacrylic acid (MAA), 30% of methyl methacrylate (MMA) and 30% of styrene (St), which has 0.4 equivalents (corresponding to 40%) of glycidyl acrylate (GMA) attached to the carboxylic groups (MAA) by addition reaction (acid value 95).

D. Photoreactive Compound
  Trimethylolpropane triacrylate

E. Solvent
  A mixed solvent of γ-butyrolactone, butanol, isopropyl alcohol and toluene (5:75:5:15)

F. Photopolymerization Initiator
  α-aminoacetophenone

G. Sensitizer
  2,4-diethylthioxanethone

H. Plasticizer
  Dibutyl phthalate (DBP)

I. Dispersant
  Cation and Floren (G-700)

<Preparation of Green Sheet> a. Preparation of Organic Vehicle

The solvent and the polymer binder were mixed and the mixture was heated to 120° C. under stirring to uniformly dissolve the entire polymer binder. The solution was then cooled to room temperature and the photopolymerization initiator was added and dissolved. The resulting solution was filtered through a 400-mesh filter to obtain an organic vehicle.

b. Treatment of Ceramics Powder with UV Absorber

A prescribed amount of the organic dye was weighed and the organic dye was dissolved in isopropyl alcohol (IPA). A cation dispersant was added to the solution and the resultant was uniformly stirred with a homogenizer. A prescribed amount of the ceramics powder was added to this solution and then IPA was evaporated at 150–200° C. using a rotary evaporator while uniformly stirring the mixture. By this operation, ceramics powder in which each particle's surface was uniformly coated with the organic dye (i.e., the powder was subjected to encapsulation treatment) was obtained. The absorbances of the powders are shown in Tables 6 and 7.

c. Preparation of Slurry

The photoreactive compound, the ceramics powder (ceramics powder encapsulated with the organic dye), Floren dispersant, the sensitizer and the plasticizer were added to the above-described organic vehicle to attain a prescribed composition. The mixture was mixed using an attriter for 24 hours in wet condition. The resultant was defoamed in a vacuum stirrer for 24 hours to obtain a slurry.

The viscosity of the prepared slurry determined using a Brookfield viscometer (type: PVDV-II+) at a revolution of 50 rpm was 2000 cps.

The compositions of the slurries are shown in Tables 6 and 7.

d. Preparation of Green Sheet

Molding of the green sheets was carried out by the doctor blade method in an UV-cut room. The gap between the polyester carrier film and the blade was 0.7–1.0 mm and the molding rate was 1 m/min. The thicknesses of the obtained green sheets are shown in Tables 6 and 7.

e. Exposure and Development

Each of the green sheets prepared above was cut into square pieces sizing 150 mm×150 mm, and each of the square pieces was heated at 90° C. for 40 minutes to evaporate the solvent. Through a chromium mask having 3000 via holes with a diameter of 60 $\mu$m, the sheet was exposed to UV light emitted from an ultra high pressure mercury lamp with an output power of 500 mJ/cm$^2$, which lamp was arranged above the mask. The sheet was then immersed in 0.5 wt % aqueous monoethanolamine solution kept at 25° C. to develop the sheet and the via holes which were not photo-set were washed off with water using a spray.

f. Printing and Lamination

In the via holes of the green sheets, thick paste of tungsten (when ceramics powder (1) was used) or silver-palladium alloy (when ceramics powder (2) or (3) was used) was embedded by screen printing method to form conductors for connecting lines in the different layers. On the surface of each of the green sheets, a prescribed circuit pattern was printed using the same thick paste as mentioned above.

Six green sheets on which the conductor was printed were laminated using a guide hole, and the laminate was subjected to thermocompression bonding at 120° C. under a pressure of 150 kg/cm$^2$ to obtain multilayer ceramics green sheets each of which has 6 layers.

g. Sintering

The green sheets having the silver-palladium alloy as the conductor were baked in the air at 500° C. for 3 hours to evaporate the binder, and then sintered at 900–1000° C. for 1.5 hours to obtain multilayer ceramics substrates.

The green sheets having tungsten as the conductor were baked in an atmosphere of H$_2$ (hydrogen) gas and N$_2$ (nitrogen) gas at 500° C. for 5 minutes to evaporate the binder and then sintered at 1600° C. for 1.5 hours to obtain multilayer ceramics substrates.

The sintering temperatures are shown in Tables 6 and 7.

TABLE 6

|  | Example 27 | Example 28 | Example 29 | Example 30 | Example 31 | Example 32 |
|---|---|---|---|---|---|---|
| ① Alumina | 83 | 85 | 88 | 0 | 0 | 0 |
| ② Cordierite | 0 | 0 | 0 | 85 | 90 | 0 |
| ③ Glass-ceramics | 0 | 0 | 0 | 0 | 0 | 83 |
| 1 UV Absorber | 0.5 | 0.5 | 0.5 | 0 | 0 | 0 |
| ② UV Absorber | 0 | 0 | 0 | 1.0 | 1.0 | 0 |
| Absorbance | 55 | 52 | 51 | 60 | 62 | 45 |
| Polymer Binder | 10 | 7.5 | 6 | 7.5 | 3 | 8.5 |
| Monomer | 7 | 7.5 | 6 | 7.5 | 7 | 8.5 |
| Photopolymerization Initiator | 1.7 | 1.5 | 1.5 | 2 | 2 | 1.7 |
| Sensitizer | 2 | 2 | 2 | 2 | 2 | 1.5 |
| Sintering Temperature (°C.) | 1600 | 1600 | 1600 | 950 | 950 | 900 |
| Thickness (°C.) | 150 | 155 | 150 | 148 | 145 | 150 |

TABLE 7

|  | Example 33 | Example 34 | Example 35 | Example 36 | Example 37 |
|---|---|---|---|---|---|
| ① Alumina | 0 | 0 | 80 | 0 | 0 |
| ② Cordierite | 0 | 0 | 0 | 80 | 0 |
| ③ Glass ceramics | 87 | 90 | 0 | 0 | 80 |
| 1 UV Absorber | 0.5 | 0.5 | 0 | 0 | 0 |
| ② UV Absorber | 0 | 0 | 0.3 | 0.3 | 0.3 |
| Absorbance | 50 | 47 | 49 | 61 | 40 |
| Polymer Binder | 6.5 | 5 | 14 | 14 | 14 |
| Monomer | 6.5 | 5 | 6 | 6 | 6 |
| Sensitizer | 1.5 | 1.5 | 0 | 0 | 0 |
| Photopolymerization Initiator | 1.3 | 1.0 | 2 | 2 | 2 |
| Sintering Temperature (°C.) | 900 | 900 | 1600 | 950 | 900 |
| Thickness ($\mu$m) | 152 | 155 | 145 | 143 | 140 |

Thus, by employing the green sheet containing a photo-setting resin, via holes are formed by photolithography, so that the produced ceramics, multilayer substrate can have fine via holes, which is advantageous for compaction and high densification of the devices. A screen for forming via holes is not necessary, and the green sheets are aligned by self-alignment. Therefore, unlike the conventional green sheets, the green sheets according to the present invention are not shifted when-they are laminated. Since uniform via holes can be formed by photo-setting and the via holes are fine, pores are not formed in the via holes, so that cutting of the lines was not observed at all. As a result, a high reliability was obtained. Further, when compared with the conventional multilayer substrates having via holes with diameters 4–8 times larger than those of the substrates according to the present invention, rate of propagation of signals was largely decreased.

Comparative Examples 3 and 4

53% of the powder composition (alumina powder (1) (Comparative Example 3) or cordierite powder (2) (Comparative Example 4), 10% of the acrylate resin, 24% of toluene, 8% of isopropyl alcohol and 5% of dibutyl phthalate were mixed using an attriter and green sheets with a thickness of 150 μm were prepared by the doctor blade method under the same conditions as mentioned above. Then 2000 via holes having a diameter of 80 μm ere formed by punch press method using a metal mold, and multilayer ceramics circuit substrates were obtained.

In the thus prepared ceramics multilayer circuit. substrates, in the vicinity of the conductor lines and the via holes, a number of cracks, burrs and peeling off of the electrodes were observed.

Industrial Availability

With the ceramics green sheet according to the present invention, via holes and through holes may be very easily formed with high precision, and fine holes may be formed reliably and inexpensively. Therefore, the green sheet according to the present invention may suitably be employed for forming sintered ceramics substrates, especially those on which semiconductor devices connected one another are mounted with a high density, especially for forming multilayer ceramics substrates.

We claim:

1. A ceramics green sheet comprising a mixture of a ceramics powder, a UV absorber selected from the group consisting of organic dyes and inorganic powders having an absorbance at a wavelength of 350–450 nm, a photoinitiator and a photosensitive resin composition, wherein said ceramics powder is covered with said UV absorber.

2. The ceramics green sheet according to claim 1, wherein said UV absorber has an integrated value of absorbance at 350–450 nm of 30–150.

3. A ceramics green sheet comprising a mixture of a ceramics powder, a UV absorber selected from the group consisting of organic dyes and inorganic powders having an absorbance at a wavelength of 350–450 nm, a photoinitiator, a photosensitive resin composition and a stabilizer.

4. The ceramics green sheet according to claim 3, wherein said stabilizer is a triazole compound.

5. The ceramics green sheet according to claim 3, wherein said photosensitive resin composition contains a photosensitive polymer.

6. A ceramics green sheet comprising a mixture of a ceramics powder, a UV absorber selected from the group consisting of organic dyes and inorganic powders having an absorbance wavelength of 350–450 nm, a photoinitiator and a photosensitive resin composition, which has a thickness of 5–500 μm.

7. The ceramics green sheet according to claim 6, wherein said photosensitive resin composition contains a photosensitive polymer.

8. A ceramics green sheet comprising a mixture of a ceramics powder, a UV absorber selected from the group consisting of organic dyes and inorganic powders having an absorbance at a wavelength of 350–450 nm, a photoinitiator and a photosensitive resin composition, wherein said photosensitive resin composition includes a compound selected from the group consisting of aromatic diazo compounds, aromatic azide compounds, organic halogen compounds, inorganic salts of diazo compounds, complexes of diazo compounds and inorganic acids, quinone diazo compounds including a polymer binder and quinodiazo compounds bonded to a polymer binder.

9. A ceramics green sheet comprising a mixture of a ceramics powder, a UV absorber selected from the group consisting of organic dyes and inorganic powders having an absorbance at a wavelength of 350–450 nm, a photoinitiator and a photosensitive resin composition, wherein said inorganic powders are selected from the group consisting of carbon, carbides, borides and nitrides.

10. The ceramics green sheet defined in claim 9 wherein said carbides are selected from the group consisting of titanium carbide, tungsten carbide, zirconium carbide, silicon carbide and niobium carbide, said borides are selected from the group consisting of titanium boride and zirconium boride and said nitrides are selected from the group consisting of titanium nitride, zirconium nitride and tantalum nitride.

11. A ceramics green sheet comprising a mixture of a ceramics powder, a UV absorber selected from the group consisting of organic dyes and inorganic powders having an absorbance at a wavelength of 350–450 nm, a photoinitiator and a photosensitive resin composition wherein said inorganic powder is added in an amount of between 0.2–5% by weight based on the weight of the ceramics powder.

12. A multilayer ceramics green sheet produced by exposing and developing a ceramics green sheet comprising a mixture of a ceramics powder, a UV absorber selected from the group consisting of organic dyes and inorganic powders having an absorbance at a wavelength of 350–450 nm, a photoinitiator and a photosensitive resin composition, attaching an electroconductive material, and then laminating a plurality of the resulting sheets.

13. The multilayer ceramics green sheet according to claim 12, wherein said photosensitive resin composition contains a photosensitive polymer.

\* \* \* \* \*

UNITED STATES PATENT AND TRADEMARK OFFICE
CERTIFICATE OF CORRECTION

PATENT NO.: 6,004,705
DATED: December 21, 1999
INVENTOR(S): Takaki Masaki, Takao Kitagawa, Akiko Yoshimura and Keiji Iwanaga It is certified that error appears in the above-identified patent and that said Letters Patent is hereby corrected as shown below:

In Column 18, in Table 2, Column 4 under Heading "Example 9", Row 9, please change "i0" to --10--; and Column 5 under Heading "Example 10", Row 8, please change "i0" to --10--.

In Column 26, in Table 6, Column 1, Row 4, please change "1 UV Absorber" to --① UV Absorber--;

Row 14, please change "(°C.)" to --($\mu$m)--;

in Table 7, Column 1, Row 4, please change "1 UV Absorber" to --① UV Absorber--.

Signed and Sealed this

Fifth Day of December, 2000

Q. TODD DICKINSON

Attest:

Attesting Officer

Director of Patents and Trademarks